United States Patent [19]

Bream et al.

[11] Patent Number: 5,019,823
[45] Date of Patent: May 28, 1991

[54] FREQUENCY MEASUREMENT

[75] Inventors: David R. Bream, Uxbridge; Stephen J. Roome, West Drayton, both of England

[73] Assignee: Thorn EMI PLC, London, England

[21] Appl. No.: 446,543

[22] Filed: Dec. 5, 1989

[30] Foreign Application Priority Data

Dec. 10, 1988 [GB] United Kingdom ................. 8828912

[51] Int. Cl.⁵ .............................................. H04B 7/00
[52] U.S. Cl. .................... 342/175; 324/78 R; 342/192
[58] Field of Search ..................... 342/13, 14 NS, 192; 324/78 R, 82

[56] References Cited

U.S. PATENT DOCUMENTS

| 4,249,179 | 2/1981 | Kolacny | 342/ |
| 4,504,786 | 3/1985 | Slaughter | 324/78 R |
| 4,542,657 | 9/1985 | Barber et al. | 342/ |
| 4,633,516 | 12/1986 | Tsui | 342/192 |
| 4,743,905 | 5/1988 | Wiegan | 342/14 |

Primary Examiner—Mark Hellner
Attorney, Agent, or Firm—Fleit, Jacobson, Cohn, Price, Holman & Stern

[57] ABSTRACT

An apparatus for measuring the frequency of an input signal is described. The apparatus uses a quadrature sampling system to obtain values of the instantaneous phase of the signals at a succession of time intervals, the values being converted into cumulative phase values. An estimate of the frequency is obtained by determining the gradient of the straight line which would best pass through a plot of the values of cumulative phase against time.

3 Claims, 4 Drawing Sheets

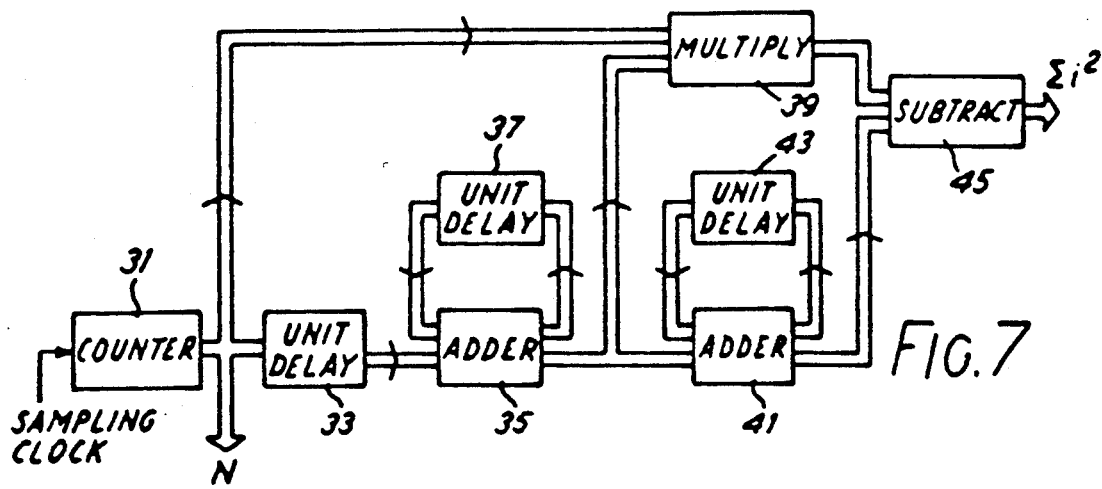
FIG.7
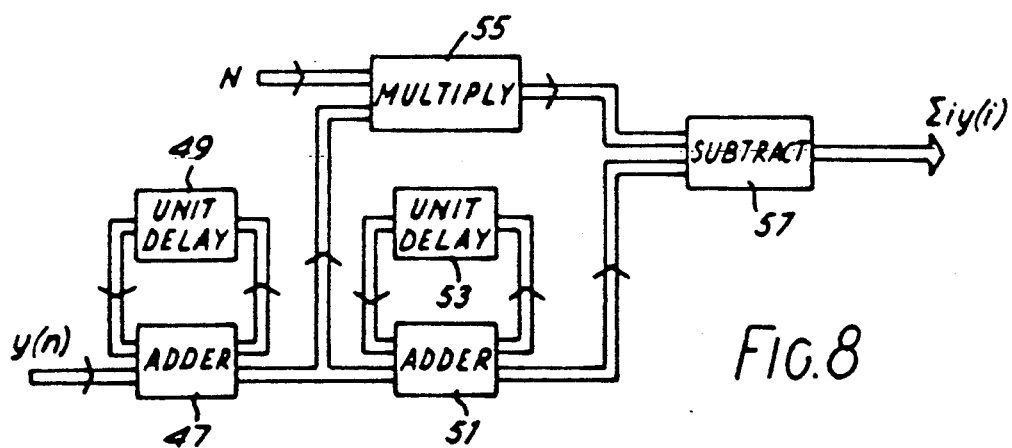
FIG.8
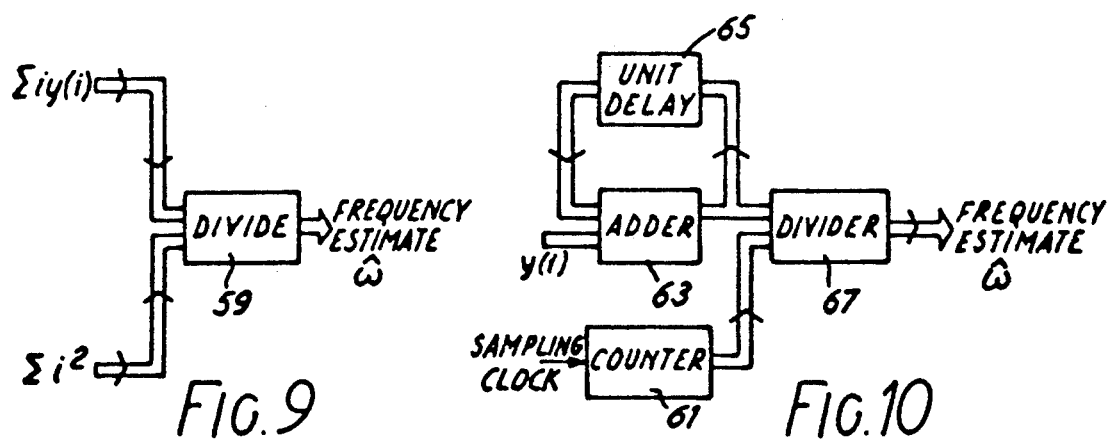
FIG.9
FIG.10

FREQUENCY MEASUREMENT

BACKGROUND OF THE INVENTION

This invention relates to frequency measurement. Frequency measurement of an incoming signal is required in a number of circumstances, for example for measuring the centre frequency of radio and microwave signals.

Known methods of frequency measurement include the use of pulse counting, as described for example in UK Paten Application GB NO. 2196497A. An alternative method of frequency measurement involves the use of transformation techniques for transferring between the time domain to the frequency domain, as described for example in U.S. Pat. No. 4,743,905.

Such known methods suffer the disadvantage however that they require comparatively long sampling of the input signal.

SUMMARY OF THE INVENTION

It is an object of the present invention to provide a method of frequency measurement, together with apparatus for implementing such a method, wherein this disadvantage is at least alleviated.

According to a first aspect of the present invention a method for measuring the frequency of a signal comprises: obtaining values of the cumulative phase of the signal at a succession of time intervals, and determining the gradient of the straight line which would best pass through a plot of the values against time so as to obtain an estimate of the frequency of the signal.

The invention thus resides in the appreciation by the inventors that it is possible to obtain estimates of the frequency of a signal from measurements of the cumulative phase of the signal without it being necessary to measure other parameters such as the amplitude of the signal. By use of such a method it is possible to obtain a frequency measurement to a particular accuracy in a much shorter time than is generally achieved by known frequency measurement techniques.

In one particular method in accordance with the invention the values of the cumulative phase are obtained by means of a quadrature sampling method. The estimated frequency thus corresponds to the difference in frequency between the frequency of a local oscillator, and the carrier frequency of an input signal. The gradient of the straight line may be obtained by means of a least squares fit technique.

According to a second aspect of the present invention, an apparatus for measuring the frequency of a signal comprises: means for obtaining values of the cumulative phase of the signal at a succession of time intervals; and means for determining the gradient of the straight line which would best pass through a plot of the values against time so as to obtain an estimate of the frequency of the signal.

Three frequency measurement apparatus in accordance with the invention together with their mode of operation will now be described, by way of example only, with reference to the accompanying drawings in which:

BRIEF DESCRIPTION OF THE DRAWINGS

FIGS. 7, 8 and 9 are schematic representations of the circuitry required to obtain the required frequency measurement from the cumulative phase values y(n) in the second apparatus; and FIG. 10 is a schematic representation of the circuitry required to obtain the required frequency measurement from the cumulative phase values y(n) in the third apparatus.

DETAILED DESCRIPTION OF THE INVENTION

The first apparatus to be described is a high precision system using a quadrature sampling system for obtaining digital values of the instantaneous phase $\phi(n)$ measured at any particular time n of an input signal at equal time intervals. The apparatus also includes further stages for converting the phase $\phi(n)$ into cumulative phase y(n) and hardware for implementing a least squares fit procedure to determine the gradient of the line which best passes through a plot of the cumulative phase y(n) against sampling intervals.

Figure 1:
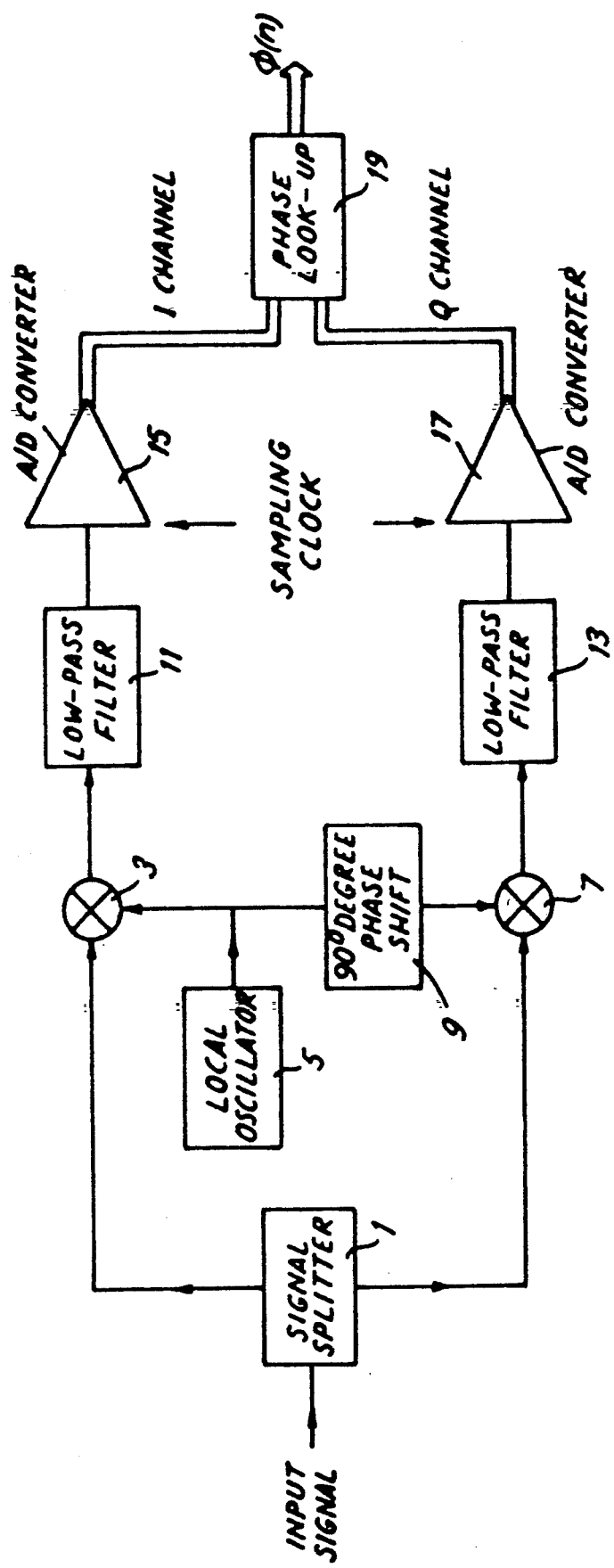
FIG. 1 is a schematic representation of a quadrature sampling system for obtaining digital values of the instantaneous phase $\phi(n)$ of an input signal, this system forming part of all three frequency measurement apparatus to be described.

Referring firstly particularly to FIG. 1 the incoming signal, whose frequency it is required to determine, is split equally between two channels by signal splitter 1. The split signal in the first channel, the 'inphase' or I channel, is multiplied at multiplier 3 by a sinusoidal signal from a local oscillator 5. The split signal in the second channel, the 'quadrature' or Q channel, is multiplied at multiplier 7 by the same local oscillator signal after it has been phase shifted by 90 degrees at the phase shifter 9. The resultant signals in the two channels are then filtered by respective low-pass filters 11, 13 to remove the upper sideband, and digitised by respective analogue/digital converters 15, 17, the two channels being matched such that the digitisation in the two channels occurs simultaneously.

Figure 2:
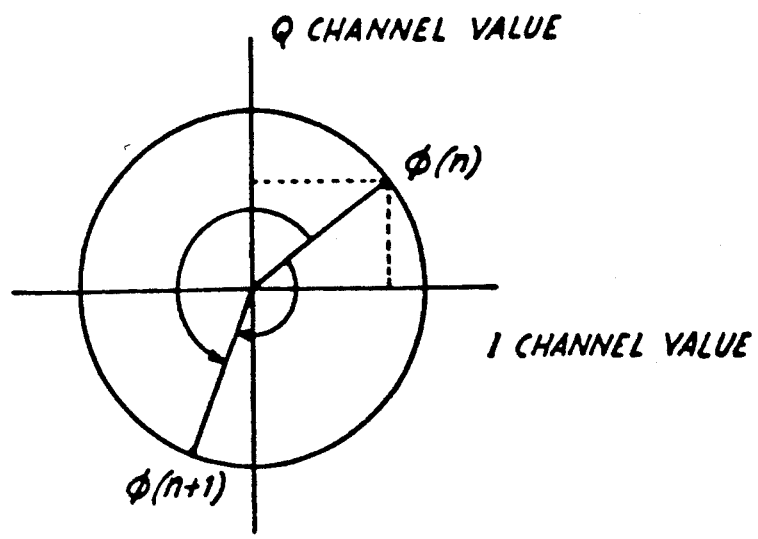
FIG. 2 is a graphical representation of the measured phase $\phi(n)$ of the input signal.

Referring now also to FIG. 2, the resultant digital numbers in each channel describe the I and Q components of a signal of carrier frequency equal to the difference between the signal generated by the local oscillator 5 and the frequency of the input signal, where the input signal is sinusoidal, or the carrier frequency of the input signal where the input signal is a modulated sinusoidal. The phase $\phi(n)$ of the signal may be represented graphically as illustrated in FIG. 2, as a vector rotating in a circle. The amplitude of the signal is given by the magnitude of this vector, whilst the phase $\phi(n)$ is equal to the arc tangent of the ratio of the signals in the Q and I channels. In the particular apparatus being described, however, the value of $\phi(n)$ is derived from the I and Q digital numbers using a look-up table 19.

Figure 3:
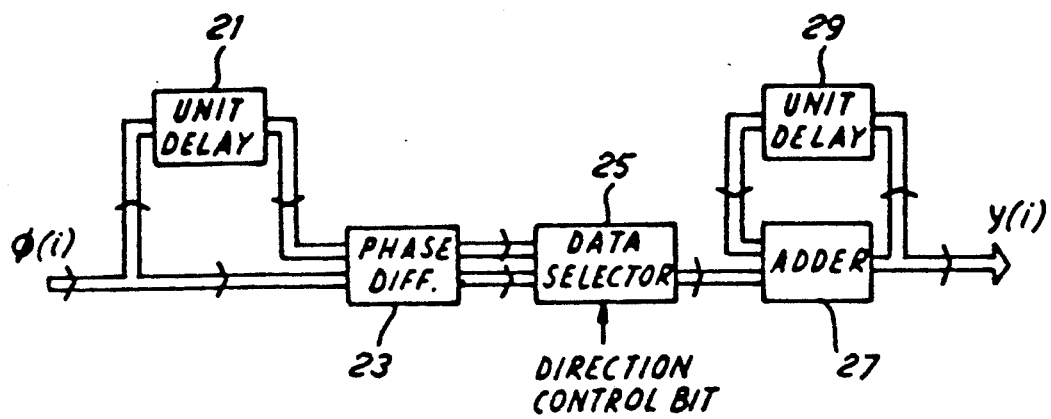
FIG. 3 is a schematic representation of a system for obtaining the cumulative phase value y(n) from the measured phase $\phi(n)$.

It will be appreciated that each value of $\phi(n)$ will lie between minus 180 degrees and plus 180 degrees. In order to convert these values into cumulative phase y(n), the difference between successive phase measurements $\phi(n)$, $\phi(n+1)$ must be added to the last cumulative phase value to create the next value this process being known as "phase unwrapping". It will be seen from FIG. 2 that obtaining the correct phase difference $\phi(n+1)-\phi(n)$ will depend on correctly interpreting the direction, i.e. clockwise or anticlockwise, in which the signal phase has changed between the two measurements. If relatively rapid phase measurements are made to high precision it may be assumed that the phase change has occurred in the direction of least distance. FIG. 3 illustrates schematically the hardware used to create the cumulative phase y(n). A portion of the digital signal $\phi(n)$ is delayed by one time unit in the unit delay 21. A phase difference device 23 creating two values of the phase difference from the present $\phi(n)$ and previous $\phi(n-1)$ values of the measured phase, one value of the phase difference describing a clockwise rotation of the vector in FIG. 2, the other an anti-clockwise rotation. The device 23 may be constituted by a look-up table, each entry of which contains two values, or alternatively by two digital subtraction circuits. A selector circuit 25 chooses one of the two values of phase difference, for a high precision system this decision being made by a magnitude comparator which chooses the smallest value. An accumulator comprising an adder 27, and a unit delay then produces a set of values y(i) where i defines equal time intervals 0, 1, 2, 3, ... (n−1),n, ... (N−1), N being the number of samples.

It will be seen that a straight line having the formula $$Y(i) = y(iT) = wt + b \qquad \text{(equation 1)}$$

may be drawn through a graphical representation of the values y(i) against i, where t is time, T is the actual duration of each of the equal time intervals, and b is the initial phase. This line will have a gradient which is equivalent to the difference in frequencies between the input signal and that of the local oscillator 5. A least squares fit technique may be used to give an estimate w of the value of w from the set of values of y(i) as follows.

The sum S of the squared error in the set of values y(i) is given by the expression:

$$S = \sum_{i=0}^{N-1} (Y(i) - (\hat{Y}(i))^2 = \sum_{i=0}^{N-1} (Y(i) - \hat{w}iT - \hat{b})^2 \qquad \text{equation 2}$$

where hats ( ) denote estimates. Differentiating with respect to w and b we obtain $$\frac{\partial S}{\partial \hat{w}} = -2T \sum_{i=0}^{N-1} (Y(i) - \hat{w}iT - \hat{b})i \qquad \text{equation 3}$$

$$\frac{\partial S}{\partial \hat{b}} = -2 \sum_{i=0}^{N-1} (Y(i) - \hat{w}iT - \hat{b}) \qquad \text{equation 4}$$

To obtain the values of w and b which minimise S we set these to zero to obtain $$\Sigma i Y(i) = \hat{w} T \Sigma i^2 + \hat{b} \Sigma i \qquad \text{equation 5}$$

$$\Sigma Y(i) = \hat{w} T \Sigma i + \hat{b} \Sigma 1 \qquad \text{equation 6}$$

Solving simultaneously we obtain $$\hat{w}T = \frac{\Sigma 1 \, \Sigma i Y(i) - \Sigma y(i) \, \Sigma i}{\Sigma i^2 \, \Sigma 1 - \Sigma i \, \Sigma i} \qquad \text{equation 7}$$

The initial phase is then obtained by rewriting equation 5 to give $$\hat{b} = \frac{Y(i) - \hat{w}T \Sigma i}{\Sigma 1} \qquad \text{equation 8}$$

Figure 4:
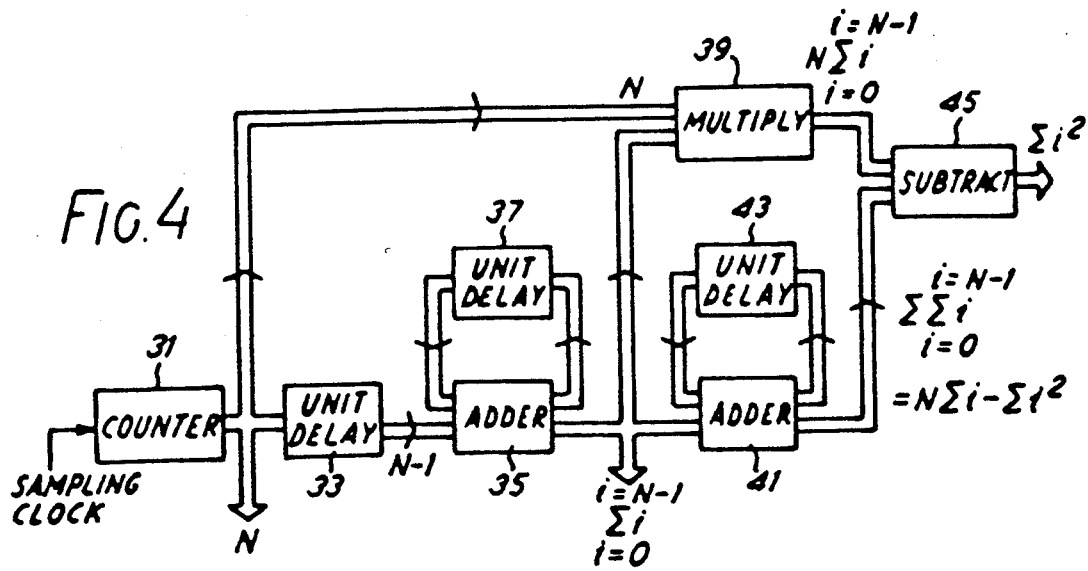
FIGS. 4, 5 and 6 are schematic representations of the circuitry required to obtain the required frequency measurement from the cumulative phase values y(n) in the first apparatus.
Figure 5:
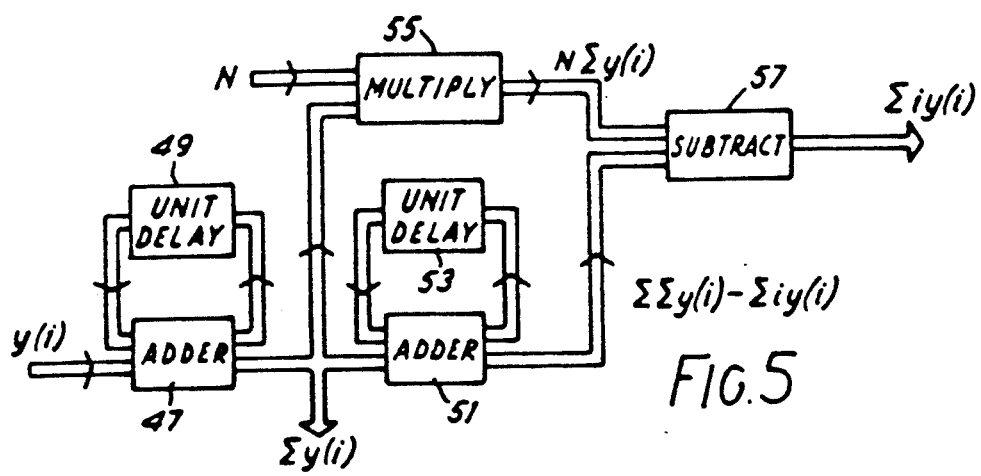

FIGS. 4 and 5 are schematic diagrams of the hardware used to create real time values of the terms N, $\Sigma i$, $\Sigma i^2$ and $\Sigma i y(i)$ for insertion into equation 7 to obtain the required value of w.

Referring firstly to FIG. 4, the same sampling clock used to clock the analogue/digital converters 15, 17 shown in FIG. 1, is used to address a counter 31 to produce the required value of N. This value forms an input into a unit delay circuit 33, and an accumulator 35, 37 arranged to give a further output $$\sum_{i=0}^{N-1} i$$

A multiplier 39, further accumulator 41, 43 and subtractor 45 are arranged as indicated in the figure to give a third output $$N \sum_{i=0}^{N-1} i - \sum_{i=0}^{N-1} \sum_{i=0}^{N-1} i = N \sum_{i=0}^{N-1} i - [N \Sigma i - \Sigma i^2] = \Sigma i^2$$

Referring now also to FIG. 5, this circuit operates in an equivalent manner to that of FIG. 4 to produce an output $\Sigma y(i)$ using an accumulator 47, 49 from an input of y(i), and an output of $\Sigma i y(i)$ from the values of N and y(i) using a further accumulator 51, 53, a multiplier 55, and a subtractor 57. Thus using the derived values of N, $\Sigma i y(i)$, $\Sigma y(i)$, $\Sigma i$ and $\Sigma i^2$ produced by the circuits shown in FIGS. 4 and 5, together with the arrangement of multipliers 59, 61, 63 and 65, subtractors 67, 69 and divider 71 shown in FIG. 6, an estimate w of the required frequency may be derived from equation 7. It will be seen from FIGS. 4, 5 and 6 that the apparatus may be used for very high speed operation. Only the simple operations of addition and delay take place at the sampling clock rate, the multiplications and divisions only being necessary each time the frequency estimate is updated, which can be at a sub-multiple of the clock rate.

If the input signal is sinusoidal the estimate w thus derived is the best estimate that can be obtained from the sampled data. The errors in the y(i) points will then be due to the phase quantisation. Assuming that the phase error has a uniform distribution over one quantisation interval, if the analogue/digital converters 15, 17 and look-up table 19 of FIG. 1 give p phase quantisation levels the r.m.s. quantisation error is $2/p\sqrt{12}$. Using standard statistical techniques, and assuming that the phase measurement errors are dominated by quantization noise which is uniformly distributed and statistically independent, it can be shown that the error $\sigma$ in the frequency estimation is given by the expression:

$$\sigma \Omega \frac{2\pi}{pN^{3/2}}$$

It will be appreciated that the method described herebefore will give estimates of frequency which are orders of magnitude more accurate than those obtainable using known methods using similar numbers of sampling periods.

The apparatus described herebefore has been designed to give the capability of high accuracy measurements. To enable very high speed operation however it may be expedient to replace the analogue to digital converters 15, 17 in the quadrature sampling system shown in FIG. 1 by comparators which detect the polarity of their input signal and give a 1 or 0 output as a result. This system would then only be capable of distinguishing the four phase states in each of the I-Q quadrants in the graphical representation of FIG. 2, with all amplitude information being lost. The dynamic range of the system would then in principle be infinite and no phase look-up table would be required. Such a system suffers the disadvantage however that a large amount of noise will be superimposed on the true phase signal $\phi(n)$. Assuming, however, that the sense in which the phase signal rotates does not change over a period of several samples, a phase change histogram may be created over this period, the phase change histogram being interpreted in such a way that its variance is minimised.

It has been found that whilst the apparatus described herebefore gives accurate results, errors in the frequency measurement depend on the frequency of the input signal which may be disadvantageous in some applications. This effect is exacerbated in the case where the analogue to digital converters of FIG. 1 are replaced by comparators. This problem can be overcome at the expense of increasing the average measurement error, by adding phase noise to the input signal, a step which may be conveniently carried out at the local oscillator 5.

Referring now to FIGS. 7 to 9 the second apparatus to be described incorporates equivalent quadrature sampling and phase unwrapping systems to those used in the first apparatus. The hardware used to obtain the required frequency estimation from the cumulative phase values y(i) is simplified however at the expense of accuracy in the frequency estimates. This may be achieved by assuming that the estimated phase intercept b is zero. Thus rearrangement of equation 5 yields $$\hat{w} T \Omega \underline{\simeq} \frac{\Sigma i y(iT)}{\Sigma i^2} \qquad \text{equation 9}$$

Figure 6:
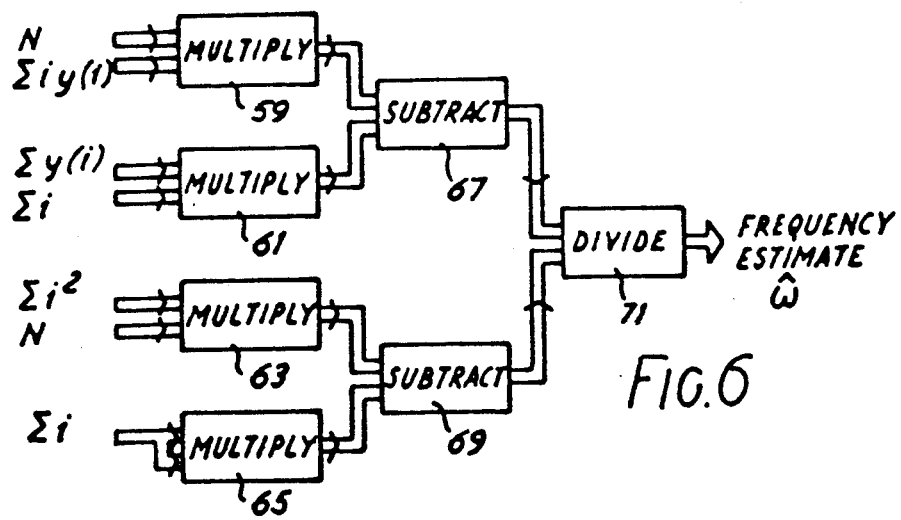

The combinations of counter, unit delays, adders, multipliers, and subtractors are the same as those shown in FIGS. 5 and 6 in respect of the first apparatus, and are thus equivalently labelled. Only values of N and $\Sigma i^2$ are obtained from the circuit shown in FIG. 7 however, with only a value of $\Sigma i y(i)$ being obtained from the circuit shown in FIG. 8. Referring now only to FIG. 9, an estimate of the required frequency is obtained by using a divider 5 to obtain a value for the ratio $$\frac{\Sigma i y(i)}{\Sigma i^2}$$

The true value of b will depend on the phase estimation process used, but it is possible to arrange for b to be within one phase quantisation interval of zero. The error $\sigma$ in the value of w using the second apparatus is then given by $$\sigma = \frac{\pi \sqrt{3}}{p(2N - 1)}$$

The third apparatus to be described achieves a further reduction in the hardware used to obtain the required frequency estimation from the cumulative phase values y(i).

This is again achieved by assuming that the estimated phase intercept $\hat{b}$ is zero. Rearrangements of equation 6 yields $$\hat{w} T \Omega \underline{\simeq} \frac{\Sigma y(iT)}{\Sigma i}$$

The quadrature sampling and phase unwrapping systems are again equivalent to those described in respect of the first apparatus. Referring to FIG. 10 the apparatus includes a counter 61 responsive to the sampling clock to produce a value of N. The values of y(i) are input into an accumulator 63, 65 to produce the term $$\sum_{i=0}^{N-1} y(i)$$

a divider then producing the ratio $$\frac{\Sigma y(i)}{N}$$

The error $\sigma$ in the value of $\hat{w}$ using the third apparatus is given by $$\sigma = \frac{2\pi}{p \sqrt{3} (N - 1)}$$

It has been found that using the comparator version of the first apparatus, with a sampling rate of 1 GHz, the frequency of a 1 microsecond pulse in the frequency range 2.5 GHz to 3.5 GHz may be estimated with an r.m.s. error of 14 kHz. If the apparatus illustrated in FIG. 10 is used, this error is increased to 114 kHZ.

It will be appreciated that in each of the apparatus described herebefore, high accuracy estimations of frequency may be obtained by sampling over large values of N. Real time estimates of the frequency may however be obtained at the expense of accuracy, by taking as few as two samples.

It will be appreciated that whilst each of the apparatus described herebefore employ a quadrature sampling system to measure the phase of an incoming signal, the invention is applicable to apparatus in which the required phase measurements are achieved by alternative means. One such alternative means is a Hilbert transformation technique in which all positive frequencies are given a 90 degree phase advance and all negative frequencies are given a 90 degree phase lag. The input signal and its transformed version are then used as the equivalent I and Q channels and the phase deduced as described herebefore. Whilst such a technique leads to a sign ambiguity in the true instantaneous phase as positive and negative frequencies are indistinguishable, this may be resolved by assuming that all phase vectors rotate in the same direction, i.e. all frequencies are positive.

It will also be appreciated that whilst for a high speed system, it is particularly apt to implement the phase signal processing apparatus digitally, it would also be possible to implement an apparatus according to the invention in analogue form.

We claim:

1. Apparatus for measuring the frequency of a signal comprising; means for obtaining values of the cumulative phase of the signal at a succession of time intervals; and means for determining the gradient of a straight line which would best pass through a plot of the values against time so as to obtain an estimate of the frequency of the signal; wherein the means for obtaining values of the cumulative phase of the signal comprises a quadrature sampling system effective to produce a series of successive phase measurements of the signal, and phase unwrapping means effective to produce the values of the cumulative phase from signals representative of the successive phase measurements.

2. Apparatus according to claim 1 in which the means for determining the gradient comprises means for performing a least squares fit technique on values representative of the values of the cumulative phase against time, wherein the least squares fit is performed by digital circuitry, the circuitry being arranged such that multiplication or division operations are only necessary when an update of the frequency measurement is required.

3. Apparatus according to claim 1 including means for adding phase noise to the signal so as to reduce the dependency of the error in the frequency measurement on the frequency of the signal.

* * * * *